US012604757B2

(12) United States Patent
Noh et al.

(10) Patent No.: US 12,604,757 B2
(45) Date of Patent: Apr. 14, 2026

(54) SEMICONDUCTOR PACKAGE

(71) Applicant: Samsung Electronics Co., Ltd., Suwon-si (KR)

(72) Inventors: Bo In Noh, Suwon-si (KR); Jeong Hoon Ahn, Suwon-si (KR); Yun Ki Choi, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 567 days.

(21) Appl. No.: 17/986,995

(22) Filed: Nov. 15, 2022

(65) Prior Publication Data

US 2023/0317539 A1 Oct. 5, 2023

(30) Foreign Application Priority Data

Apr. 5, 2022 (KR) ........................ 10-2022-0041944

(51) Int. Cl.
H01L 23/31 (2006.01)
H01L 23/498 (2006.01)
(Continued)

(52) U.S. Cl.
CPC ....... H10W 74/121 (2026.01); H10W 70/685 (2026.01); H10W 74/124 (2026.01); H10W 90/00 (2026.01); H10W 72/07252 (2026.01); H10W 72/07352 (2026.01); H10W 72/07353 (2026.01); H10W 72/221 (2026.01); H10W 72/321 (2026.01); H10W 72/332 (2026.01); H10W 72/334 (2026.01); H10W 74/00 (2026.01); H10W 74/10 (2026.01);
(Continued)

(58) Field of Classification Search
CPC .................................................. H01L 23/3135
See application file for complete search history.

(56) References Cited

U.S. PATENT DOCUMENTS 7,911,047 B2 3/2011 Hasegawa et al.
9,553,036 B1 1/2017 Hsu et al.
(Continued)

FOREIGN PATENT DOCUMENTS

KR 101261485 B1 5/2013
KR 10-2018-0067973 A 6/2018
KR 10-2021-0103167 A 8/2021

OTHER PUBLICATIONS

European Search Report, dated Sep. 5, 2023, issued in corresponding European Patent Application No. 23161836.4.
(Continued)

*Primary Examiner* — William A Harriston
(74) *Attorney, Agent, or Firm* — Fish & Richardson P.C.

(57) ABSTRACT

A semiconductor package includes a circuit board, an interposer structure on the circuit board, a first semiconductor chip and a second semiconductor chip on the interposer structure, the first and the second semiconductor chips electrically connected to the interposer structure and spaced apart from each other, and a mold layer between the first and second semiconductor chips, the mold layer separating the first and second semiconductor chips. A slope of a side wall of the mold layer is constant as the side wall extends away from an upper side of the interposer structure, and an angle defined by a bottom side of the mold layer and the side wall of the mold layer is less than or equal to ninety degrees.

19 Claims, 18 Drawing Sheets

(51) Int. Cl.

| | |
|---|---|
| *H01L 25/065* | (2023.01) |
| *H10W 70/685* | (2026.01) |
| *H10W 72/00* | (2026.01) |
| *H10W 72/20* | (2026.01) |
| *H10W 72/30* | (2026.01) |
| *H10W 74/00* | (2026.01) |
| *H10W 74/10* | (2026.01) |
| *H10W 74/15* | (2026.01) |
| *H10W 74/40* | (2026.01) |
| *H10W 76/63* | (2026.01) |
| *H10W 90/00* | (2026.01) |
| *H01L 23/00* | (2006.01) |

(52) U.S. Cl.
CPC .......... *H10W 74/127* (2026.01); *H10W 74/15* (2026.01); *H10W 74/40* (2026.01); *H10W 76/63* (2026.01); *H10W 90/401* (2026.01); *H10W 90/701* (2026.01); *H10W 90/724* (2026.01); *H10W 90/734* (2026.01)

(56) References Cited

U.S. PATENT DOCUMENTS

| | | | |
|---|---|---|---|
| 9,659,907 B2 * | 5/2017 | Zhai ...................... H01L 21/561 |
| 10,325,880 B2 | 6/2019 | Woychik et al. |
| 11,075,167 B2 | 7/2021 | Gutierrez, III et al. |
| 2008/0211094 A1 | 9/2008 | Hirata |
| 2009/0115069 A1 | 5/2009 | Kim et al. |
| 2014/0252579 A1 * | 9/2014 | Chang ................... H01L 23/481 |
| | | | 257/676 |
| 2015/0287697 A1 * | 10/2015 | Tsai ....................... H01L 24/97 |
| | | | 257/773 |
| 2016/0005714 A1 * | 1/2016 | Lee ....................... H01L 23/367 |
| | | | 257/777 |
| 2017/0141088 A1 * | 5/2017 | Zhai ..................... H01L 21/561 |
| 2018/0134546 A1 | 5/2018 | Oh et al. |
| 2020/0185357 A1 | 6/2020 | Byun et al. |
| 2020/0203309 A1 | 6/2020 | Beyne |
| 2021/0028080 A1 * | 1/2021 | Pietambaram ...... H01L 21/6835 |
| 2021/0111125 A1 * | 4/2021 | Chen ................... H01L 23/5386 |
| 2021/0257275 A1 | 8/2021 | Park et al. |

OTHER PUBLICATIONS

European Office Action, dated Sep. 15, 2023, issued in corresponding European Patent Application No. 23161836.4.

Office Action in Korean Appln. No. 10-2022-0041944, mailed on Sep. 10, 2025, 19 pages (with English translation).

* cited by examiner

SEMICONDUCTOR PACKAGE

CROSS-REFERENCE TO RELATED APPLICATION

This application claims priority from Korean Patent Application No. 10-2022-0041944 filed on Apr. 5, 2022 in the Korean Intellectual Property Office, and all the benefits accruing therefrom under 35 U.S.C. 119, the contents of which in its entirety are herein incorporated by reference.

FIELD

Some of the example embodiments relate to a semiconductor package, including a semiconductor package in which a mold layer is first formed and then a semiconductor chip is mounted on an interposer structure.

BACKGROUND

An interposer market is growing due to high specifications of set and adoption of high bandwidth memory (HBM). For example, in the case of a semiconductor package using a silicon-based interposer, it may be fabricated by mounting a semiconductor chip on the silicon-based interposer, and by molding the mounted semiconductor chip with a molding material.

First, when the semiconductor package is fabricated by mounting the semiconductor chip and then molding the mounted semiconductor chip with the molding material, a wafer warpage may occur due to a difference in coefficient of thermal expansion (CTE) between silicon of a thin thickness and silicon of a thick thickness. This may lead to misalignment between the semiconductor chip and the pad.

SUMMARY

Some of the example embodiments provide a semiconductor package capable of improving reliability of a product.

However, the example embodiments are not restricted to the ones set forth herein. The above and other example embodiments will become more apparent by referencing the detailed description of some of the example embodiments given below.

According to some of the example embodiments, a semiconductor package includes a circuit board, an interposer structure on the circuit board, a first semiconductor chip and a second semiconductor chip on the interposer structure, the first and the second semiconductor chips electrically connected to the interposer structure and spaced apart from each other, and a mold layer between the first and second semiconductor chips, the mold layer separating the first and second semiconductor chips, wherein a slope of a side wall of the mold layer is constant as the side wall extends away from an upper side of the interposer structure, and wherein an angle defined by a bottom side of the mold layer and the side wall of the mold layer is less than or equal to ninety degrees.

According to some of the example embodiments, a semiconductor includes a circuit board, an interposer structure on the circuit board, a mold layer on the interposer structure, wherein the mold layer defines a first trench and a plurality of second trenches around the first trench, an area of a cross section of the first trench from a planar viewpoint is greater than an area of a cross section of any one of the plurality of second trenches from the planar viewpoint, a slope of a side wall of the mold layer is constant as the side wall extends away from an upper side of the interposer structure, an angle defined by a side wall of the first trench and a bottom side of the first trench is greater than or equal to ninety degrees, and an angle defined by a side wall of at least one of the plurality of second trenches and a bottom side of the at least one of the plurality of second trenches is less than or equal to ninety degrees, a logic chip in the first trench, the logic chip electrically connected to the interposer structure, and a memory chip in at least one of the plurality of second trenches, the memory chip electrically connected to the interposer structure.

According to some of the example embodiments, a semiconductor package includes a circuit board, an interposer structure on the circuit board, a mold layer on the interposer structure, the mold layer defining a first trench and a plurality of second trenches around the first trench, a logic chip in the first trench, the logic chip electrically connected to the interposer structure, a memory chip in at least one of the plurality of second trenches, the memory chip electrically connected to the interposer structure, a first connecting member between the circuit board and the interposer structure, the first connecting member electrically connecting the circuit board and the interposer structure, a second connecting member between the interposer structure and the logic chip, the second connecting member electrically connecting the interposer structure and the logic chip, a third connecting member between the interposer structure and the memory chip, the third connecting member electrically connecting the interposer structure and the memory chip, and a heat slug on the circuit board, the heat slug covering the logic chip and the memory chip, wherein the interposer structure includes an interposer, an interlayer insulating layer on the interposer, redistribution layers in the interlayer insulating layer, and a through via connected to the redistribution layer, and the redistribution layers are electrically connected to the logic chip and the memory chip, wherein an area of a cross section of the first trench from a planar viewpoint is greater than an area of a cross section of any one of the plurality of the second trenches from a planar viewpoint, a size of the first connecting member is greater than a size of the second connecting member and a size of the third connecting member, a slope of a side wall of the mold layer is constant as the side wall extends away from an upper side of the interposer structure, and an upper side of the mold layer is on a same plane as an upper side of the logic chip and an upper side of the memory chip.

BRIEF DESCRIPTION OF THE DRAWINGS

The above and other example embodiments will become more apparent by describing in detail some of the example embodiments with reference to the attached drawings, in which.

DETAILED DESCRIPTION

Hereinafter, a semiconductor package according to an example embodiment will be described referring to FIGS. 1 to 12. In FIGS. 1 to 12, the semiconductor package according to some example embodiments may be a 2.5D package including a silicon interposer. However, this is merely an example, and example embodiments not limited thereto.

Figure 1:
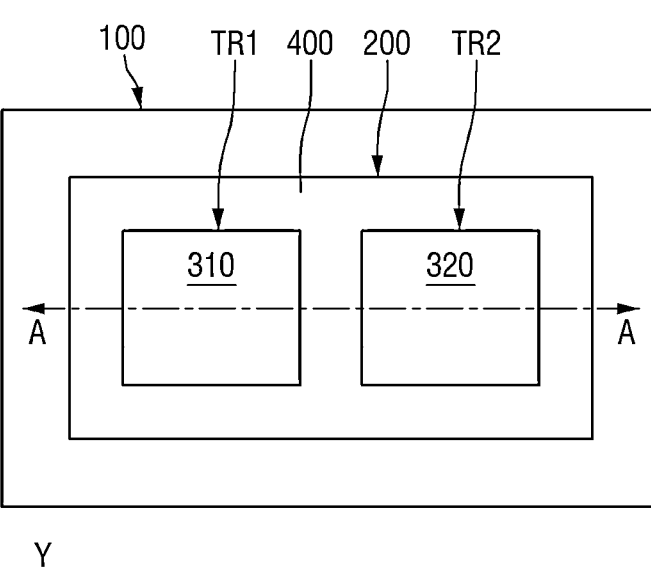
FIG. 1 is an example plan view for explaining a semiconductor package according to some example embodiments.
Figure 2:
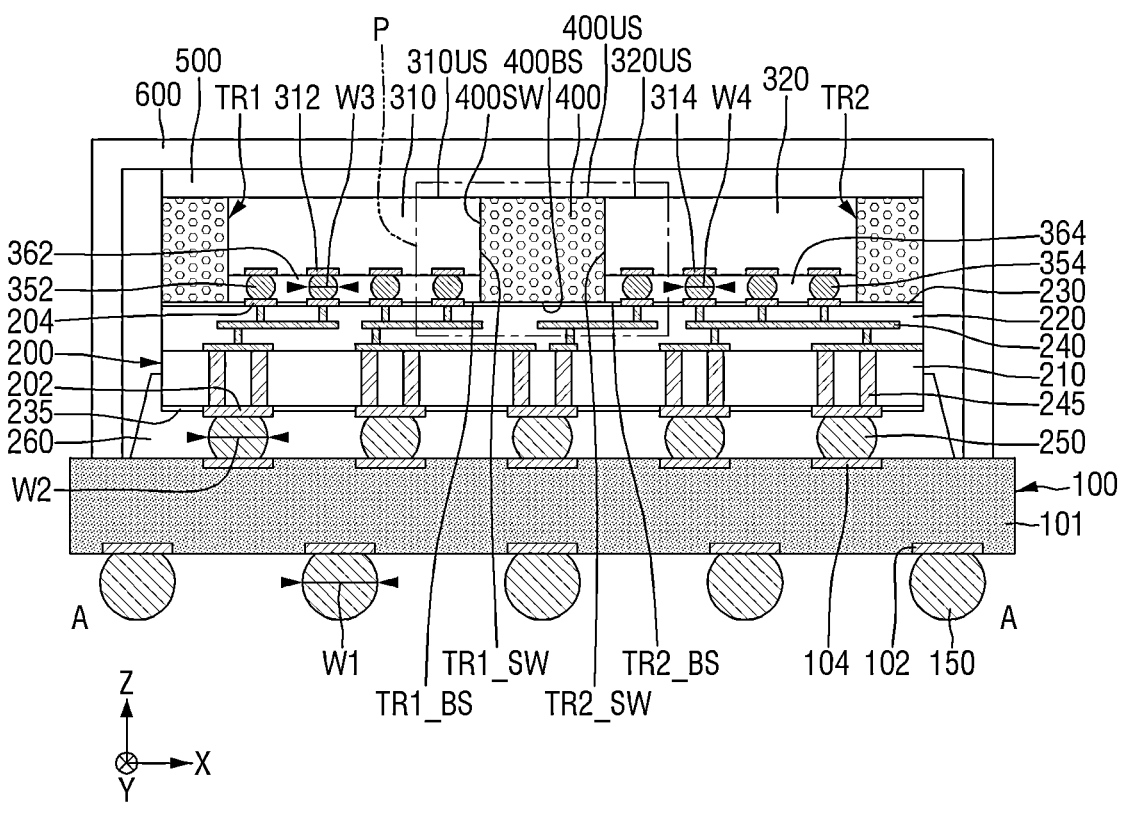
FIG. 2 is an example cross-sectional view taken along a line A-A of FIG. 1.

FIG. 1 is an example plan view for explaining a semiconductor package according to some example embodiments. FIG. 2 is an exemplary cross-sectional view taken along a line A-A of FIG. 1.

Referring to FIGS. 1 and 2, the semiconductor package according to some example embodiments may include a circuit board 100, an interposer structure 200, a first semiconductor chip 310, a second semiconductor chip 320, and a mold layer 400.

The mold layer 400 may include a first trench TR1, and a second trench TR2 placed around the first trench TR1. The first semiconductor chip 310 may be mounted in the first trench TR1, and the second semiconductor chip 320 may be mounted in the second trench TR2.

The first semiconductor chip 310 and the second semiconductor chip 320 may be spaced apart from each other in a first direction X. As used herein, the first direction X, a second direction Y, and a third direction Z may intersect each other. The first direction X, the second direction Y, and the third direction Z may be substantially perpendicular to each other. Although each of one first semiconductor chip 310 and one second semiconductor chip 320 is shown in FIG. 1, example embodiments are not limited thereto. A semiconductor package according to some example embodiments may include one first semiconductor chip 310 and a plurality of second semiconductor chips 320.

The circuit board 100 may be a packaging board. The circuit board 100 may be a printed circuit board (PCB). The circuit board 100 may include a lower side and an upper side that are opposite to each other. The upper side of the circuit board 100 may face the interposer structure 200.

The circuit board 100 may include an insulating core 101, a first board pad 102, and a second board pad 104. The first board pad 102 and the second board pad 104 may each be used to electrically connect the circuit board 100 to other components. For example, the first board pad 102 may be exposed from the lower side of the insulating core 101, and the second board pad 104 may be exposed from the upper side of the insulating core 101. The first board pad 102 and the second board pad 104 may include, but not limited to, metal materials such as, for example, copper (Cu) or aluminum (Al).

Wiring patterns for electrically connecting the first board pad 102 and the second board pad 104 may be formed inside the insulating core 101. Although the insulating core 101 is shown to be a single layer, this is only for convenience of explanation. For example, the insulating core 101 may be made up of multiple layers, and wiring patterns of a multilayer may be formed therein.

The circuit board 100 may be mounted on a motherboard of an electronic device or the like. For example, a first connecting member 150 connected to the first board pad 102 may be provided. The circuit board 100 may be mounted on the motherboard of an electronic device or the like through the first connecting member 150. The circuit board 100 may be, but is not limited to, a BGA (Ball Grid Array) board.

The first connecting member 150 may be, for example, but is not limited to, a solder bump. The first connecting member 150 may have various shapes such as a land, a ball, a pin, and a pillar. The number, spacing, placement, form, and the like of the first connecting member 150 are not limited to those shown in the drawings, and may vary depending on the design.

In some example embodiments, the insulating core 101 may include organic matter. For example, the insulating core 101 may include a pre-preg. The pre-preg is a composite fiber obtained by impregnating a reinforcing fiber such as carbon fiber, glass fiber, or aramid fiber with a thermosetting polymer binder (e.g., epoxy resin) or a thermoplastic resin in advance.

In some example embodiments, the circuit board 100 may include a copper clad laminate (CCL). For example, the circuit board 100 may have a structure in which copper laminate is stacked on a single side or both sides of a thermosetting pre-preg (e.g., pre-preg of a C-stage).

The interposer structure 200 may be placed on the upper side of the circuit board 100. The interposer structure 200 may include a lower side and an upper side that are opposite to each other. The upper side of the interposer structure 200 may face the first and second semiconductor chips 310 and 320. The lower side of the interposer structure 200 may face the circuit board 100. The interposer structure 200 facilitates the connection between the circuit board 100 and first and second semiconductor chips 310 and 320 to be described later, and may inhibit or prevent warpage of the semiconductor package.

The interposer structure 200 may be placed on the circuit board 100. The interposer structure 200 may include an interposer 210, an interlayer insulating layer 220, a first passivation film 230, a second passivation film 235, redistribution layers 240, a through via 245, a first interposer pad 202, and a second interposer pad 204.

The interposer 210 may be provided on the circuit board 100. The interposer 210 may be, for example, but is not limited to, a silicon (Si) interposer. The interlayer insulating layer 220 may be placed on the interposer 210. The interlayer insulating layer 220 may include an insulating material. For example, the interlayer insulating layer 220 may include, but is not limited to, silicon oxide, silicon nitride, silicon oxynitride, and a low dielectric constant (low-k) material having a lower dielectric constant than silicon oxide.

The first interposer pad 202 and the second interposer pad 204 may each be used to electrically connect the interposer structure 200 to other components. For example, the first interposer pad 202 may be exposed from the lower side of the interposer structure 200, and the second interposer pad 204 may be exposed from the upper side of the interposer structure 200. The first interposer pad 202 and the second interposer pad 204 may include, for example, but is not limited to, metal materials such as copper (Cu) or aluminum (Al). Wiring patterns for electrically connecting the first interposer pad 202 and the second interposer pad 204 may be formed inside the interposer structure 200.

For example, the redistribution layers 240 and the through via 245 may be formed in the interposer structure 200. The redistribution layers 240 may be placed inside the interlayer insulating layer 220. The through via 245 may penetrate the interposer 210. As a result, the redistribution layers 240 and the through via 245 may be connected to each other. The redistribution layers 240 may be electrically connected to the second interposer pad 204. The through via 245 may be electrically connected to the first interposer pad 202. As a result, the interposer structure 200, the first semiconductor chip 310, and the second semiconductor chip 320 may be electrically connected. The redistribution layer 240 and the through via 245 may each include, but are not limited to, metal materials such as copper (Cu) or aluminum (Al).

The interposer structure 200 may be mounted on the upper side of the circuit board 100. For example, the second connecting member 250 may be formed between the circuit board 100 and the interposer structure 200. The second connecting member 250 may connect the second board pad 104 and the first interposer pad 202. As a result, the circuit board 100 and the interposer structure 200 may be electrically connected.

The second connecting member 250 may be a low melting point metal, for example, but is not limited to, a solder bump including tin (Sn), tin (Sn) alloy, or the like. The second connecting member 250 may have various shapes such as a land, a ball, a pin, and a pillar. The second connecting member 250 may be formed of a single layer or multiple layers. When the second connecting member 250 is formed of a single layer, the second connecting member 250 may optionally include tin-silver (Sn—Ag) solder or copper (Cu). When the second connecting member 250 is formed of multiple layers, the second connecting member 250 may optionally include a copper (Cu) pillar and solder. The number, spacing, placement, form, and the like of the second connecting member 250 are not limited to those shown in the drawings, and may vary depending on the design.

In some example embodiments, the size of the first connecting member 150 may be larger than the size of the second connecting member 250. For example, a width W1 of the first connecting member 150 in the first direction X may be larger than a width W2 of the second connecting member 250 in the first direction X. A volume of the first connecting member 150 may be larger than a volume of the second connecting member 250.

The first passivation film 230 may be placed on the interlayer insulating layer 220. The first passivation film 230 may extend long along the upper side of the interlayer insulating layer 220. The second interposer pad 204 penetrates the first passivation film 230 and may be connected to the redistribution layers 240. The second passivation film 235 may be placed on the interposer 210. The second passivation film 235 may extend long along the lower side of the interposer 210. The first interposer pad 202 penetrates the second passivation film 235 and may be connected to the through via 245.

In some example embodiments, a height of the first passivation film 230 in the third direction Z may be smaller than a height of the second interposer pad 204 in the third direction Z. The second interposer pad 204 may protrude from the first passivation film 230 in the third direction Z. The height of the second passivation film 235 in the third direction Z may be smaller than the height of the first interposer pad 202 in the third direction Z. The first interposer pad 202 may protrude from the second passivation film 235 in the third direction Z. However, the example embodiments are not limited thereto.

The first passivation film 230 and the second passivation film 235 may each include silicon nitride. Unlike this, the first passivation film 230 and the second passivation film 235 may be made of a passivation material, BCB (benzocyclobutene), polybenzeneoxazole, polyimide, epoxy, silicon oxide, silicon nitride or a combination thereof, respectively, but example embodiments are not limited thereto.

In some example embodiments, a first underfill 260 may be formed between the circuit board 100 and the interposer structure 200. The first underfill 260 may fill the space between the circuit board 100 and the interposer structure 200. Further, the first underfill 260 may cover the second connecting member 250. The first underfill 260 may inhibit or prevent breakage or the like of the interposer structure 200 by fixing the interposer structure 200 onto the circuit board 100. The first underfill 260 may include, for example, but is not limited to, an insulating polymer material such as EMC (epoxy molding compound).

The first semiconductor chip 310 and the second semiconductor chip 320 may be placed on the upper side of the interposer structure 200 to be spaced apart from each other in the first direction X. The first semiconductor chip 310 and the second semiconductor chip 320 may each be an integrated circuit (IC) in which hundreds to millions or more of semiconductor elements are integrated in a single chip.

In some example embodiments, the first semiconductor chip 310 may be a logic semiconductor chip. For example, the first semiconductor chip 310 may be, but is not limited to, an application processor (AP), such as a CPU (Central Processing Unit), a GPU (Graphic Processing Unit), an FPGA (Field-Programmable Gate Array), a digital signal processor, an encryption processor, a micro processor, a micro controller, and an ASIC (Application-Specific IC).

In some example embodiments, the second semiconductor chip 320 may be a memory semiconductor chip. For example, the second semiconductor chip 320 may be a volatile memory such as a dynamic random access memory (DRAM) or a static random access memory (SRAM), or may be a non-volatile memory such as a flash memory, a PRAM (Phase-change Random Access Memory), a MRAM (Magnetoresistive Random Access Memory), a FeRAM (Ferroelectric Random Access Memory) or a RRAM (Resistive Random Access Memory), but example embodiments are not limited thereto.

As an example, the first semiconductor chip 310 may be an ASIC such as a GPU, and the second semiconductor chip 320 may be a stack memory such as High Bandwidth Memory (HBM). Such a stack memory may be in the form in which a plurality of integrated circuits are stacked. The stacked integrated circuits may be electrically connected to each other through a TSV (Through Silicon Via) or the like.

The first semiconductor chip 310 may include a first chip pad 312. The first chip pad 312 may be used to electrically connect the first semiconductor chip 310 to other components. For example, the first chip pad 312 may be exposed from the lower side of the first semiconductor chip 310.

The second semiconductor chip 320 may include a second chip pad 314. The second chip pad 314 may be used to electrically connect the second semiconductor chip 320 to other components. For example, the second chip pad 314 may be exposed from the lower side of the second semiconductor chip 320.

The first chip pad 312 and the second chip pad 314 may each include, but is not limited to, a metal material such as copper (Cu) or aluminum (Al).

The first semiconductor chip 310 and the second semiconductor chip 320 may be mounted on the upper side of the interposer structure 200. For example, a third connecting member 352 may be formed between the interposer structure 200 and the first semiconductor chip 310. The third connecting member 352 may connect a part of the plurality of second interposer pads 204 to the first chip pad 312. Accordingly, the interposer structure 200 and the first semiconductor chip 310 may be electrically connected.

Further, for example, a fourth connecting member 354 may be formed between the interposer structure 200 and the second semiconductor chip 320. The fourth connecting member 354 may connect the other part of the plurality of second interposer pads 204 to the second chip pad 314. Accordingly, the interposer structure 200 and the second semiconductor chip 320 may be electrically connected.

In some example embodiments, the size of the third connecting member 352 may be smaller than the sizes of the first connecting member 150 and the second connecting member 250. For example, a width W3 of the third connecting member 352 in the first direction X is smaller than a width W1 of the first connecting member 150 in the first direction X. The width W3 of the third connecting member 352 in the first direction X is smaller than the width W2 of the second connecting member 250 in the first direction X. The volume of the third connecting member 352 may be smaller than the volume of the first connecting member 150 and the volume of the second connecting member 250.

In some example embodiments, the size of the fourth connecting member 354 may be smaller than the size of the first connecting member 150 and the second connecting member 250. For example, the width W4 of the fourth connecting member 354 in the first direction X is smaller than the width W1 of the first connecting member 150 in the first direction X. The width W3 of the fourth connecting member 354 in the first direction X is smaller than the width W2 of the second connecting member 250 in the first direction X. The volume of the fourth connecting member 354 may be smaller than the volume of the first connecting member 150 and the volume of the second connecting member 250.

The third connecting member 352 and the fourth connecting member 354 may each be, but are not limited to, a solder bump including a low-melting point metal, for example, tin (Sn), tin (Sn) alloy, or the like. The third connecting member 352 and the fourth connecting member 354 may have various shapes such as a land, a ball, a pin, and a pillar, respectively. Further, the third connecting member 352 and the fourth connecting member 354 may each include a UBM (Under Bump Metallurgy).

The third connecting member 352 and the fourth connecting member 354 may be formed of a single layer or multiple layers, respectively. When the third connecting member 352 and the fourth connecting member 354 are each formed of a single layer, the third connecting member 352 and the fourth connecting member 354 may each include tin-silver (Sn—Ag) solder or copper (Cu) as an example. When the third connecting member 352 and the fourth connecting member 354 are each formed of multiple layers, the third connecting member 352 and the fourth connecting member 354 may each include copper (Cu) pillar and solder as an example. However, the example embodiments are not limited thereto, and the number, spacing, placement, form, and the like of each of the third connecting member 352 and the fourth connecting member 354 are not limited to those shown in the drawings, and may vary depending on the design.

In some example embodiments, a part of the redistribution layer 240 may electrically connect the third connecting member 352 and the fourth connecting member 354. For example, a part of the redistribution layer 240 may be connected to the second interposer pad 204 connected to the third connecting member 352, and may be connected to the second interposer pad 204 connected to the fourth connecting member 354. Accordingly, the first semiconductor chip 310 and the second semiconductor chip 320 may be electrically connected.

In some example embodiments, a second underfill 362 may be formed between the interposer structure 200 and the first semiconductor chip 310. A third underfill 364 may be formed between the interposer structure 200 and the second semiconductor chip 320. The second underfill 362 may fill the space between the interposer structure 200 and the first semiconductor chip 310. The third underfill 364 may fill the space between the interposer structure 200 and the second semiconductor chip 320. Further, the second underfill 362 may cover the third connecting member 352. The third underfill 364 may cover the fourth connecting member 354.

The second underfill 362 and the third underfill 364 may inhibit or prevent breakage or the like of the first and second semiconductor chips 310 and 320, by fixing the first and second semiconductor chips 310 and 320 onto the interposer structure 200. The second underfill 362 and the third underfill 364 may each, include, but are not limited to, insulating polymer materials such as EMC.

The mold layer 400 may be placed on the interposer structure 200. The mold layer 400 may be provided between the first semiconductor chip 310 and the second semiconductor chip 320. The mold layer 400 may separate the first semiconductor chip 310 and the second semiconductor chip 320 from each other.

In some example embodiments, the mold layer 400 may include a first trench TR1 and a second trench TR2. The first semiconductor chip 310 may be mounted inside the first trench TR1. The second semiconductor chip 320 may be mounted inside the second trench TR2. Although each of one first trench TR1 and one second trench TR2 is shown. In FIGS. 1 and 2, the example embodiments are not limited thereto. At least one or more first trenches TR1 and second trenches TR2 may be provided.

The mold layer 400 may include, for example, but is not limited to, an insulating polymer material such as EMC. The mold layer 400 may include a material different from the first underfill 260, the second underfill 362, and the third underfill 364. For example, the first underfill 260, the second underfill 362, and the third underfill 364 may each include an insulating material having a higher fluidity than the mold layer 400. Therefore, the first underfill 260, the second underfill 362, and the third underfill 364 may efficiently fill a narrow space between the circuit board 100 and the interposer structure 200, or between the interposer structure 200 and the first and second semiconductor chips 310 and 320.

Figure 3:
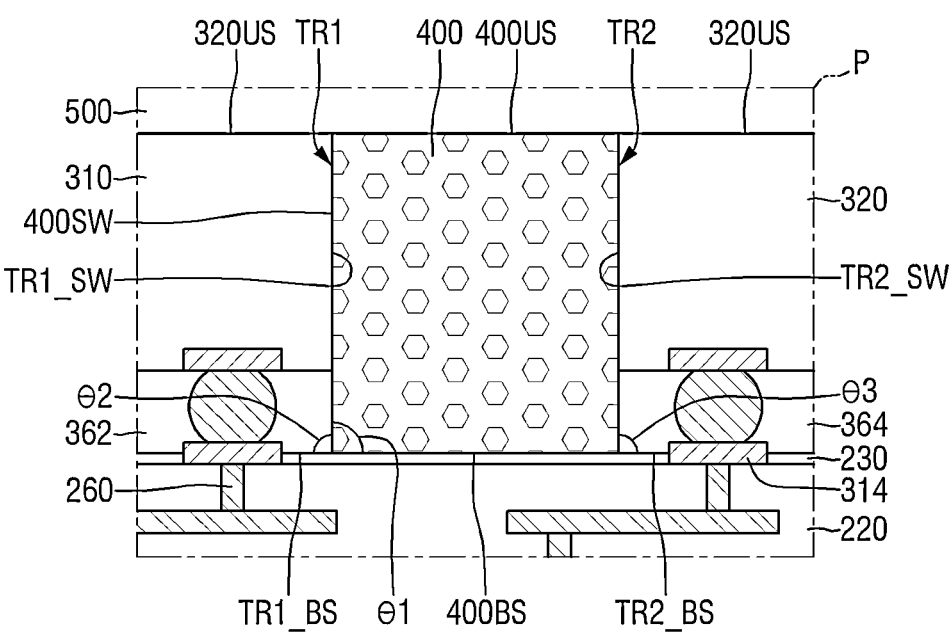
FIG. 3 is an enlarged view of a region P of FIG. 2.

FIG. 3 is an enlarged view of a region P of FIG. 2. A mold layer 400 according to some example embodiments will be described in more detail using FIG. 3.

Referring to FIG. 3, the mold layer 400 may include a pair of side walls 400SW, a bottom side 400BS, and an upper side 400US.

The upper side 400US of the mold layer 400 may come into contact with an adhesive layer 500. The upper side 400US of the mold layer 400 may be opposite to the interposer structure 200. The bottom side 400BS of the mold layer 400 may come into contact with the interposer structure 200. The upper side 400US of the mold layer 400 and the bottom side 400BS of the mold layer 400 may be opposite to each other. The side walls 400SW of the mold layer 400 may be connected to the upper side 400US of the mold layer 400, and may be connected to the bottom side 400BS of the mold layer 400.

In some example embodiments, the upper side 400US of the mold layer 400 may be placed on the same plane as the upper side 310US of the first semiconductor chip 310 and the upper side 320US of the second semiconductor chip 320. That is, a height in the third direction Z from the upper side of the interposer structure 200 to the upper side 400US of the mold layer 400 may be the same as the height in the third direction Z from the upper side of the interposer structure 200 to the upper side 310US of the first semiconductor chip 310, and the height from the upper side of the interposer structure 200 to the upper side 320US of the second semiconductor chip 320.

In some example embodiments, a slope of the side wall 400SW of the mold layer 400 may be constant as it goes away from the upper side of the interposer structure 200. That is, the side walls 400SW of the mold layer 400 may be a straight line. A first angle θ1 formed by the bottom side 400BS of the mold layer 400 and the side wall 400SW of the mold layer 400 may be 90° or less. As an example, the first angle θ1 formed by the bottom side 400BS of the mold layer 400 and the side wall 400SW of the mold layer 400 may be 90°.

That is, the side walls 400SW of the mold layer 400 may extend in the third direction Z. The mold layer 400 may be formed by first forming a pre-mold layer (e.g., 400p of FIG. 15) on the interposer structure 200 and etching the pre-mold layer (e.g., 400p of FIG. 15). The pre-mold layer (e.g., 400p of FIG. 15) may be isotropically etched in the third direction Z. Therefore, the side walls 400SW of the mold layer 400 may be a straight line.

In some example embodiments, a second angle θ2 formed by the bottom side TR1_BS of the first trench TR1 and the side wall TR1_SW of the first trench TR1 may be 90° or more. As an example, the second angle θ2 formed by the bottom side TR1_BS of the first trench TR1 and the side wall TR1_SW of the first trench TR1 may be 90°. A third angle θ3 formed by the bottom side TR2_BS of the second trench TR2 and the side wall TR2_SW of the second trench TR2 may be 90° or more. As an example, the third angle θ2 formed by the bottom side TR2_BS of the second trench TR2 and the side wall TR2_SW of the second trench TR2 may be 90°.

In some example embodiments, a contact surface on which the second underfill 362 and the mold layer 400 come into contact with each other may be a straight line. A contact surface on which the third underfill 364 and the mold layer 400 come into contact with each other may be a straight line. The side walls of the second underfill 362 and the side walls of the third underfill 364 may each be a straight line. For example, the slope of the side wall of the second underfill 362 may be constant as it goes away from the upper side of the interposer structure 200. The slope of the side wall of the third underfill 364 may be constant as it goes away from the upper side of the interposer structure 200. The angle formed by the side wall and the bottom side of the second underfill 362 may be 90° or more. The angle formed by the side wall and the bottom side of the third underfill 364 may be 90° or more. However, the example embodiments are not limited thereto.

Referring to FIG. 2 again, the semiconductor package according to some example embodiments may further include an adhesive layer 500 and a heat slug 600.

The adhesive layer 500 may be provided on the mold layer 400. The adhesive layer 500 may be provided on the first semiconductor chip 310 and the second semiconductor chip 320. The adhesive layer 500 may come into contact with the upper side 400US of the mold layer 400. The adhesive layer 500 may come into contact with the upper side 310US of the first semiconductor chip 310 and the upper side 320US of the second semiconductor chip 320. The adhesive layer 500 may bond and fix the mold layer 400, the first semiconductor chip 310, the second semiconductor chip 320, and the heat slug 600 to each other. The adhesive layer 500 may include an adhesive material. For example, the adhesive layer 500 may include a curable polymer. The adhesive layer 500 may include, for example, an epoxy-based polymer.

The heat slug 600 may be placed on the circuit board 100. The heat slug 600 may cover the first semiconductor chip 310 and the second semiconductor chip 320. The heat slug 600 may include, but is not limited to, a metal material.

Figure 4:
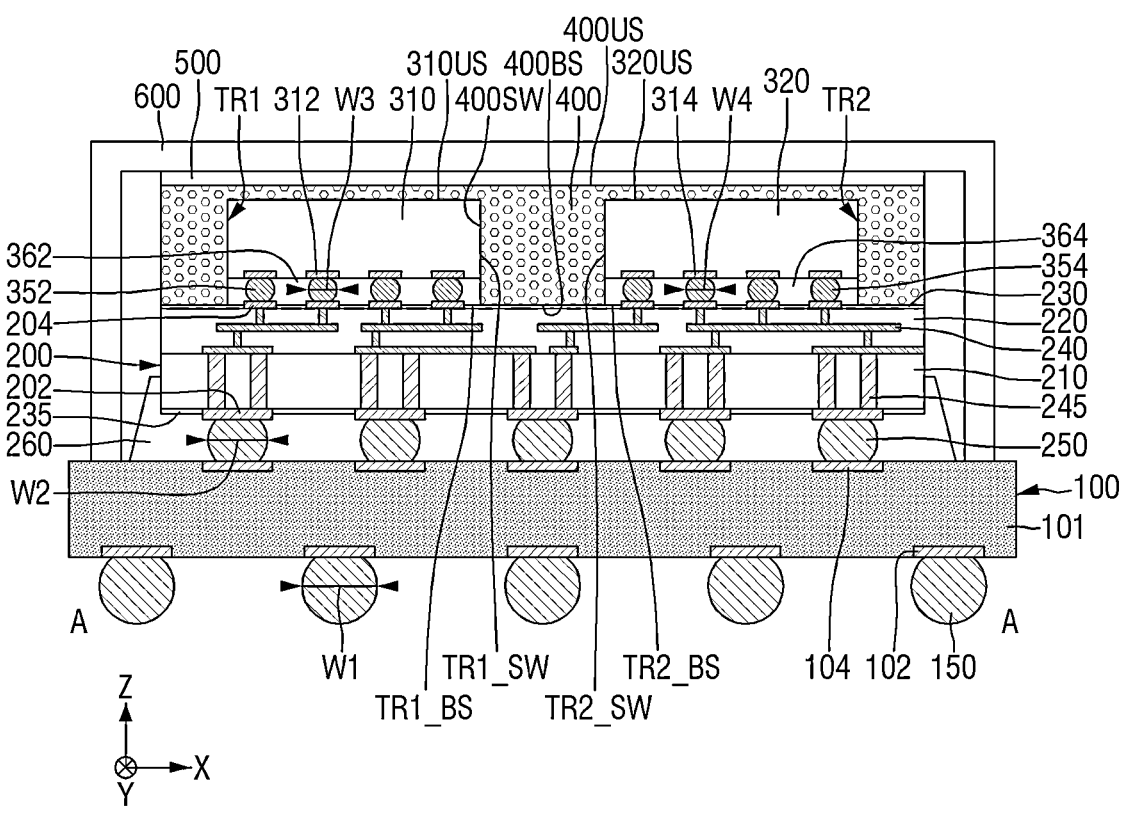
FIG. 4 is an example diagram for explaining a semiconductor package according to some example embodiments.

FIG. 4 is an example diagram for explaining a semiconductor package according to some example embodiments. For convenience of explanation, repeated contents of those explained using FIGS. 1 to 3 will be omitted.

Referring to FIG. 4, the mold layer 400 may completely cover the first semiconductor chip 310 and the second semiconductor chip 320.

A height in the third direction Z from the upper side of the interposer structure 200 to the upper side 400US of the mold layer 400 is greater than a height in the third direction Z from the upper side of the interposer structure 200 to the upper side 310US of the first semiconductor chip 310. The height in the third direction Z from the upper side of the interposer structure 200 to the upper side 400US of the mold layer 400 is greater than the height in the third direction Z from the upper side of the interposer structure 200 to the upper side 320US of the second semiconductor chip 320.

The adhesive layer 500 may adhere better to the mold layer 400 than the first and second semiconductor chips 310 and 320. As the area of the mold layer 400 coming into contact with the adhesive layer 500 is increased, a semiconductor package having high stability may be provided.

Figure 5:
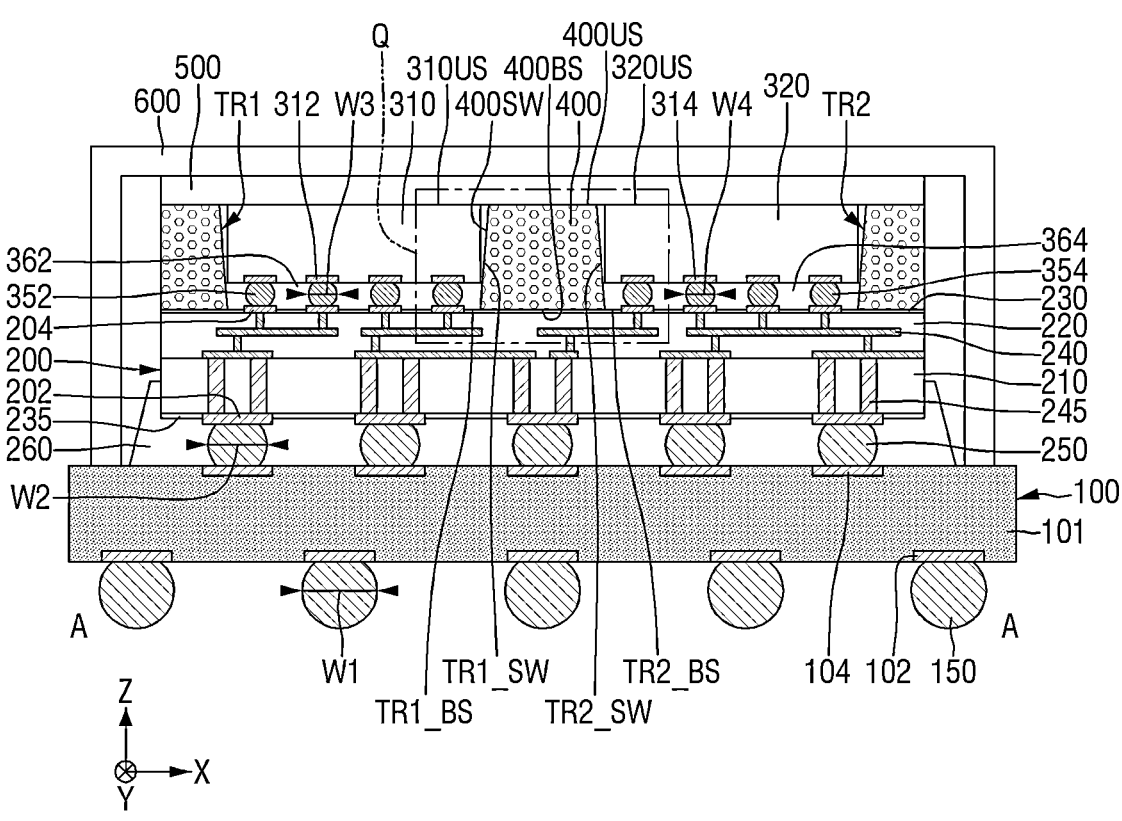
FIG. 5 is an example diagram for explaining a semiconductor package according to some example embodiments.
Figure 6:
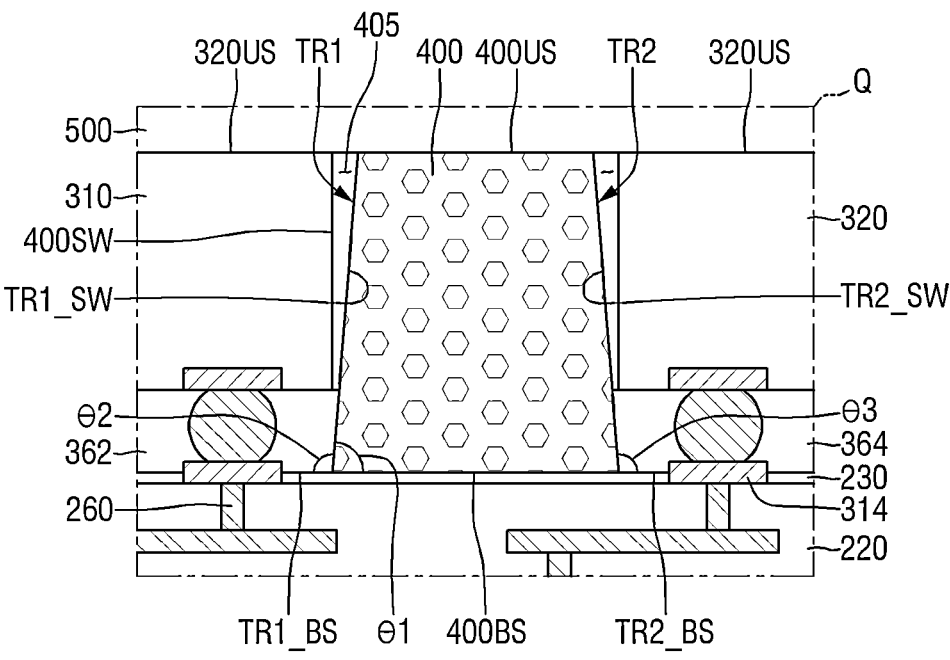
FIG. 6 is an enlarged view of a region Q of FIG. 5.

FIG. 5 is an example diagram for explaining a semiconductor package according to some example embodiments. FIG. 6 is an enlarged view of a region Q of FIG. 5. For convenience of explanation, repeated contents of those explained using FIGS. 1 to 3 will be omitted.

Referring to FIGS. 5 and 6, the semiconductor package according to some example embodiments may include an air gap 405. An angle formed by the side walls 400SW of the mold layer 400 and the bottom side 400BS of the mold layer 400 may be smaller than 90°.

In the process of etching the pre-mold layer (e.g., 400p of FIG. 15) to form the mold layer 400, the width of the first trench TR1 in the first direction X or the second direction Y may gradually decrease from the upper side of the pre-mold layer (e.g., 400p of FIG. 15) toward the interposer structure 200. That is, the side wall 400SW of the mold layer 400 may extend in a direction different from the third direction Z. The side wall 400SW of the mold layer 400 may extend in an arbitrary direction between the first direction X and the third direction Z.

In some example embodiments, the first angle θ1 formed by the side wall 400SW of the mold layer 400 and the bottom side 400BS of the mold layer 400 is smaller than 90°. The second angle θ2 formed by the side wall TR1_SW of the first trench TR1 and the bottom side TR1_BS of the first trench TR1 is greater than 90°. The third angle θ3 formed by the side wall TR2_SW of the second trench TR2 and the bottom side TR2_BS of the second trench TR2 is greater than 90°.

The air gap 405 may be placed between the mold layer 400 and the first semiconductor chip 310, or between the mold layer 400 and the second semiconductor chip 320. As a structure is provided in which the width of the first trench TR1 and the width of the second trench TR2 gradually decrease toward the interposer structure 200, and the width of the first semiconductor chip 310 and the width of the second semiconductor chip 320 are constant, the air gap 405 may be formed between the first semiconductor chip 310 and the mold layer 400, and between the second semiconductor chip 320 and the mold layer 400. In contrast, other materials may be filled between the first semiconductor chip 310 and the mold layer 400, and between the second semiconductor chip 320 and the mold layer 400.

FIGS. 7 to 12 are example diagrams for explaining a semiconductor package according to some example embodiments. For convenience of explanation, points different from those described using FIGS. 1 to 3 will be mainly described. For reference, FIGS. 7 to 12 may be example plan views of the semiconductor package according to some example embodiments.

Figure 7:
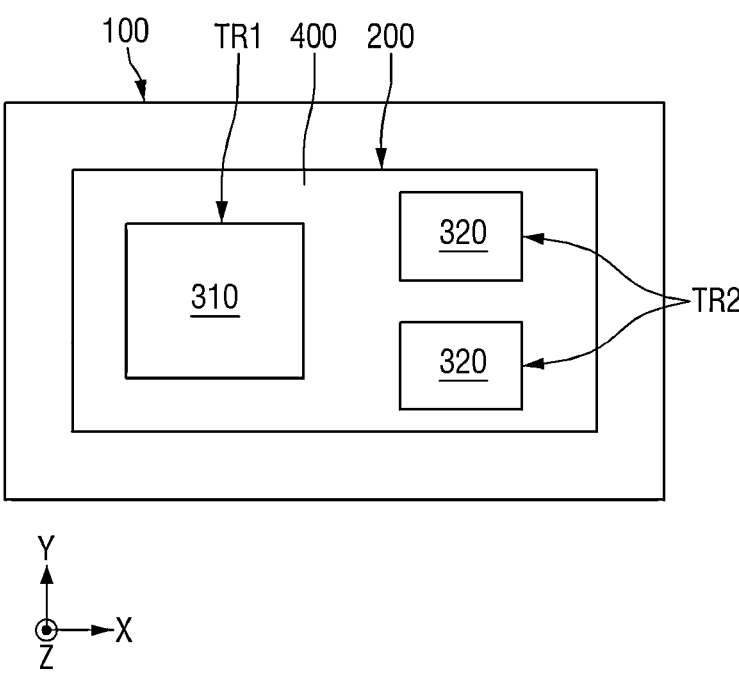
FIGS. 7, 8, 9, 10, 11 and 12 are example diagrams for explaining a semiconductor package according to some example embodiments.

First, referring to FIG. 7, a semiconductor package according to some example embodiments may include one first semiconductor chip 310 and two second semiconductor chips 320. In some example embodiments, the first semiconductor chip 310 may be a logic chip, and the second semiconductor chip 320 may be a memory chip. That is, in some example embodiments, one logic chip and a plurality of memory chips may be mounted on one interposer structure 200.

The first semiconductor chip 310 may be spaced apart from the second semiconductor chips 320 in the first direction X. The second semiconductor chips 320 may be spaced apart from each other in the second direction Y. In some example embodiments, the ratio of the first semiconductor chip 310 to the second semiconductor chip 320 may be, but is not limited to, 1:2 (e.g., one first semiconductor chip 310 for every two second semiconductor chips 320).

In some example embodiments, the area of the cross section of the first trench TR1 may be greater than the area of the cross section of the second trench TR2 from a planar viewpoint. The size of the first semiconductor chip 310 may be larger than the size of the second semiconductor chip 320. However, the example embodiments are not limited thereto.

Figure 8:
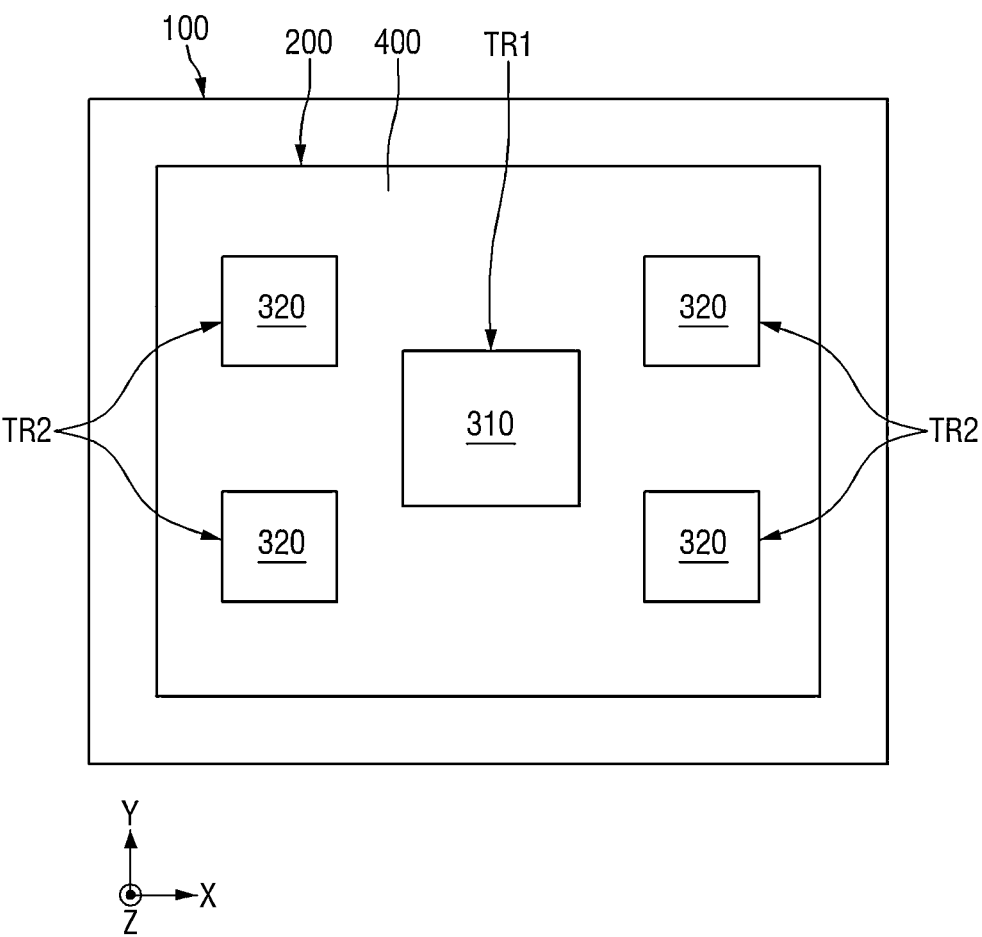

Referring to FIG. 8, the semiconductor package according to some example embodiments may include one first semiconductor chip 310 and four second semiconductor chips 320. That is, one logic chip and four memory chips may be mounted on one interposer structure 200.

The first semiconductor chip 310 may be provided between the second semiconductor chips 320. The second semiconductor chip 320 may be provided around the first semiconductor chip 310. The second semiconductor chip 320 may have a structure that surrounds the first semiconductor chip 310 from a planar viewpoint.

The first semiconductor chip 310 may be spaced apart from the second semiconductor chips 320 in the first direction X. The second semiconductor chips 320 may be spaced apart from each other in the second direction Y. In some example embodiments, the ratio of the first semiconductor chip 310 to the second semiconductor chip 320 may be, but is not limited to, 1:4.

In some example embodiments, the area of the cross section of the first trench TR1 may be greater than the area of the cross section of the second trench TR2 from a planar viewpoint. The size of the first semiconductor chip 310 may be greater than the size of the second semiconductor chip 320. However, the example embodiments are not limited thereto.

Figure 9:
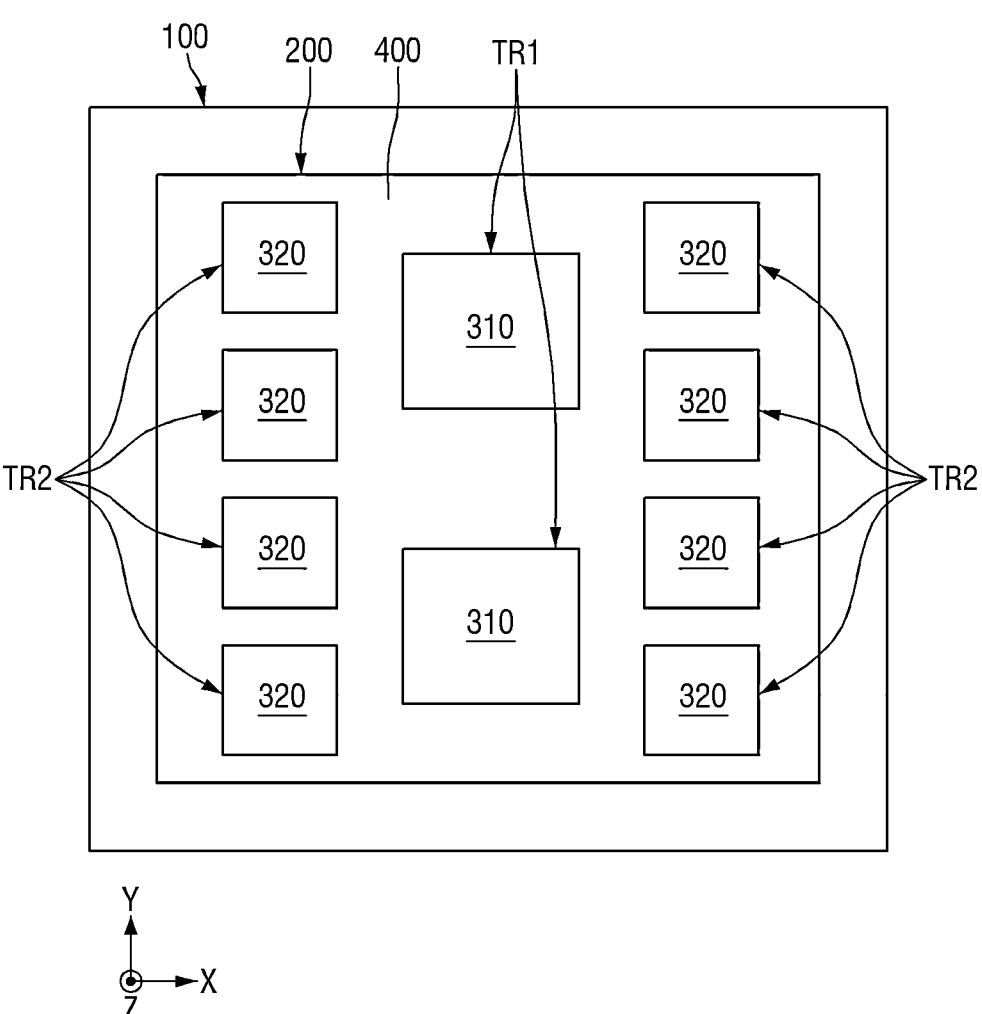

Referring to FIG. 9, the semiconductor package according to some example embodiments may include two first semiconductor chips 310 and eight second semiconductor chips 320. That is, two logic chips and eight memory chips may be mounted on one interposer structure 200.

The first semiconductor chips 310 may be spaced apart from each other in the second direction Y. The second semiconductor chips 320 may be aligned with each other in the second direction Y. The second semiconductor chip 320 may be spaced apart from each other in the first direction X and the second direction Y. The first semiconductor chip 310 may be provided between the second semiconductor chips 320. In some example embodiments, the ratio of the first semiconductor chip 310 to the second semiconductor chip 320 may be, but not limited to, 2:8.

Figure 10:
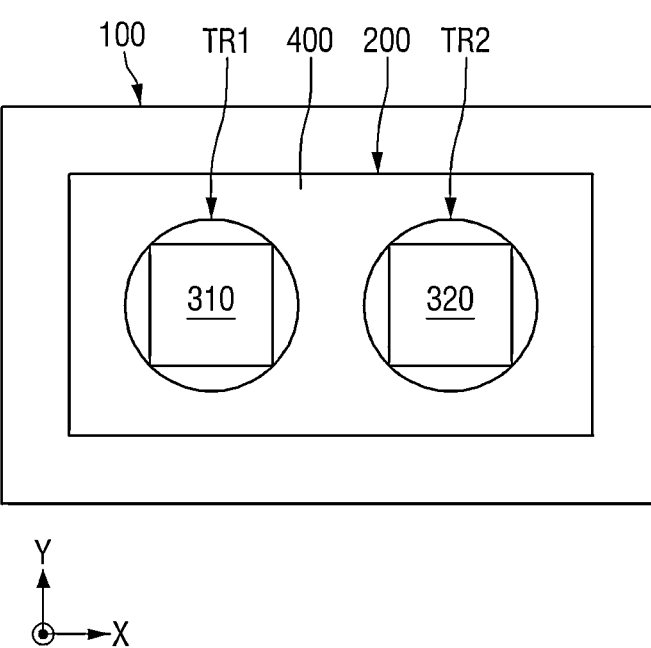
Figure 11:
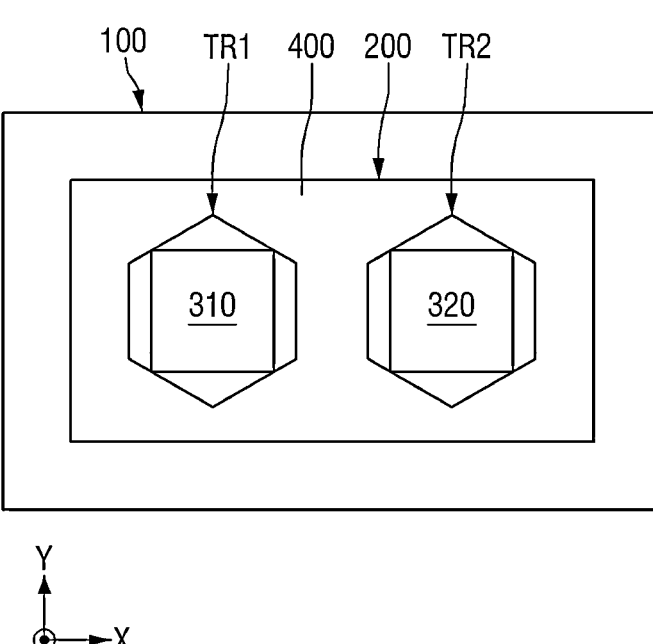
Figure 12:
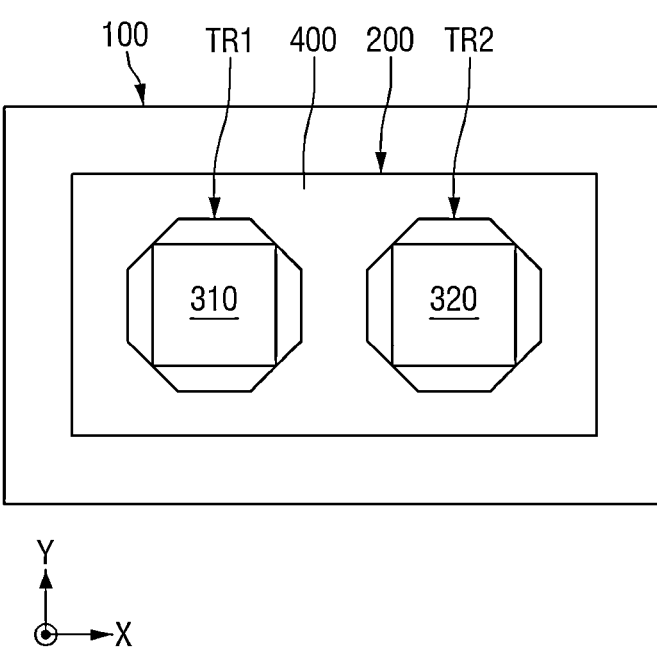

Referring to FIGS. 10 to 12, the shapes of the first trench TR1 and the second trench TR2 may be one of a circle, a hexagon or an octagon from a planar viewpoint.

Figure 15:
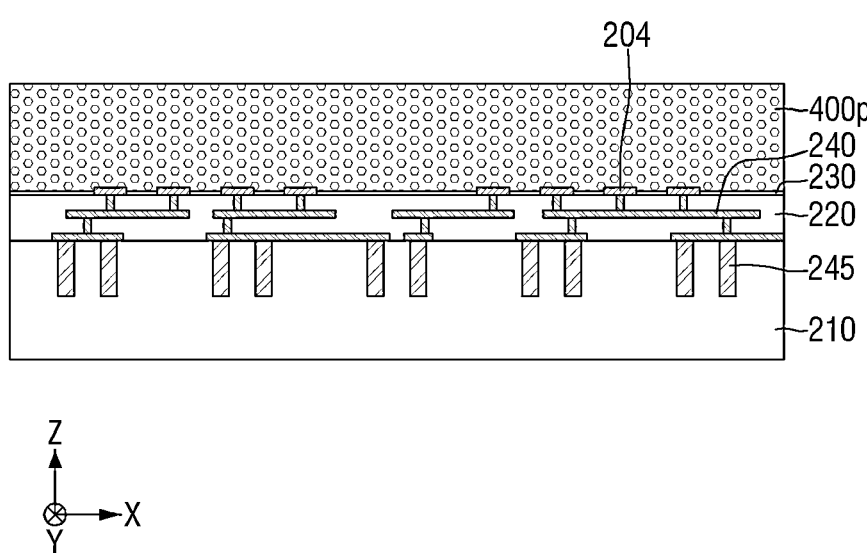

The mold layer 400 may be formed by etching the pre-mold layer (400*p* of FIG. 15). In the process of forming the mold layer 400, the first trench TR1 and the second trench TR2 may be formed. When etching is performed using a circular mask or the pre-mold layer (400*p* of FIG. 15) is etched using a laser, the cross sections of the first trench TR1 and the second trench TR2 may be formed in a circular shape from a planar viewpoint.

When the pre-mold layer (400*p* of FIG. 15) is etched using the hexagonal mask, the cross sections of the first trench TR1 and the second trench TR2 may be formed into a hexagonal shape from a planar viewpoint. When the pre-mold layer (400*p* of FIG. 15) is etched using an octagonal mask, the cross sections of the first trench TR1 and the second trench TR2 may be formed into an octagonal shape from a planar viewpoint.

In some embodiments, the shape of the first trench TR1 may be a circle, a hexagon or an octagon, and the shape of the first semiconductor chip 310 may be a square from a planar viewpoint. As a result, the side wall of the first trench TR1 and the side wall of the first semiconductor chip 310 may be spaced apart from each other. Air may be inserted into the space between the side wall of the first trench TR1 and the side wall of the first semiconductor chip 310. However, the example embodiments are not limited thereto.

The shape of the second trench TR2 may be a circle, a hexagon or an octagon, and the shape of the second semiconductor chip 320 may be a square from a planar viewpoint. As a result, the side wall of the second trench TR2 and the side wall of the second semiconductor chip 320 may be spaced apart from each other. Air may be inserted into the space between the side wall of the second trench TR2 and the side wall of the second semiconductor chip 320. However, the example embodiments are not limited thereto.

FIGS. 13 to 21 are diagrams showing sequentially the processes of fabricating a semiconductor package having the cross section of FIG. 2. Hereinafter, a method for fabricating a semiconductor package according to some example embodiments will be described referring to FIGS. 13 to 21.

Figure 13:
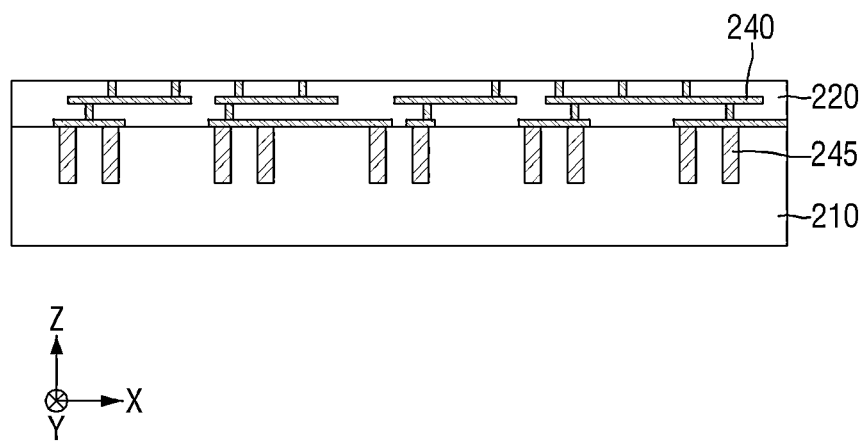
FIGS. 13, 14, 15, 16, 17, 18, 19, 20 and 21 are diagrams showing sequentially the processes of fabricating a semiconductor package having the cross section of FIG. 2.

Referring to FIG. 13, the interposer 210 may be provided. The interposer 210 may be a silicon (Si) interposer. The through via 245 may be formed inside the interposer 210.

Subsequently, the interlayer insulating layer 220 may be formed on the interposer 210. The redistribution layer 240 may be formed in the interlayer insulating layer 220. The redistribution layer 240 and the through via 245 may be electrically connected to each other.

Figure 14:
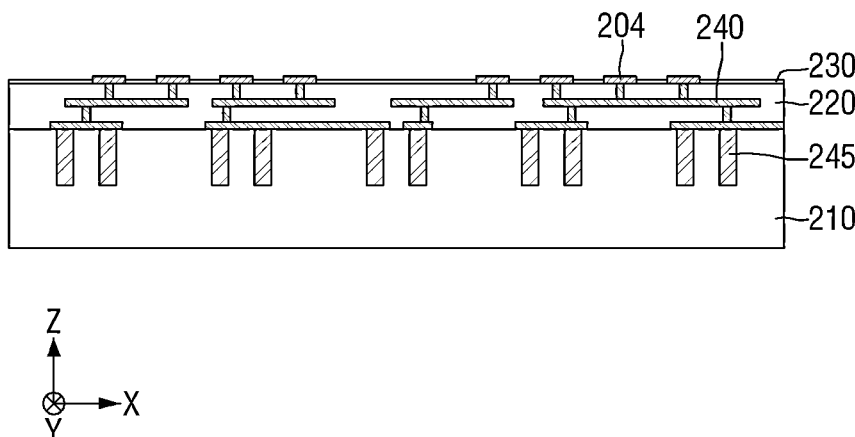

Referring to FIG. 14, the first passivation film 230 may be formed on the interlayer insulating layer 220.

Subsequently, the second interposer pad 204 that penetrates the first passivation film 230 may be formed. The second interposer pad 204 may be connected to the redistribution layers 240. In some example embodiments, the height of the first passivation film 230 may be smaller than the height of the second interposer pad 204. The second interposer pad 204 may protrude from the first passivation film 230. However, the example embodiments are not limited thereto.

Referring to FIG. 15, the pre-mold layer 400p may be formed on the first passivation film 230. The pre-mold layer 400p may cover the first passivation film 230 and the second interposer pad 204. The pre-mold layer 400p may include, but is not limited to, an insulating polymer material such as EMC.

Figure 16:
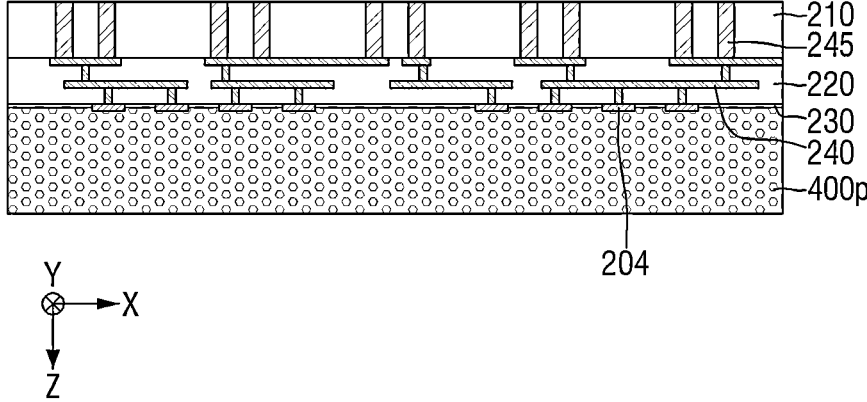

Referring to FIG. 16, the semiconductor package according to some example embodiments may be rotated by 180°. The interposer 210 may then be partially removed to expose the through via 245. For example, a part of the interposer 210 may be removed, using a chemical mechanical polishing (CMP) process. One side of the interposer 210 may expose the through via 245.

Figure 17:
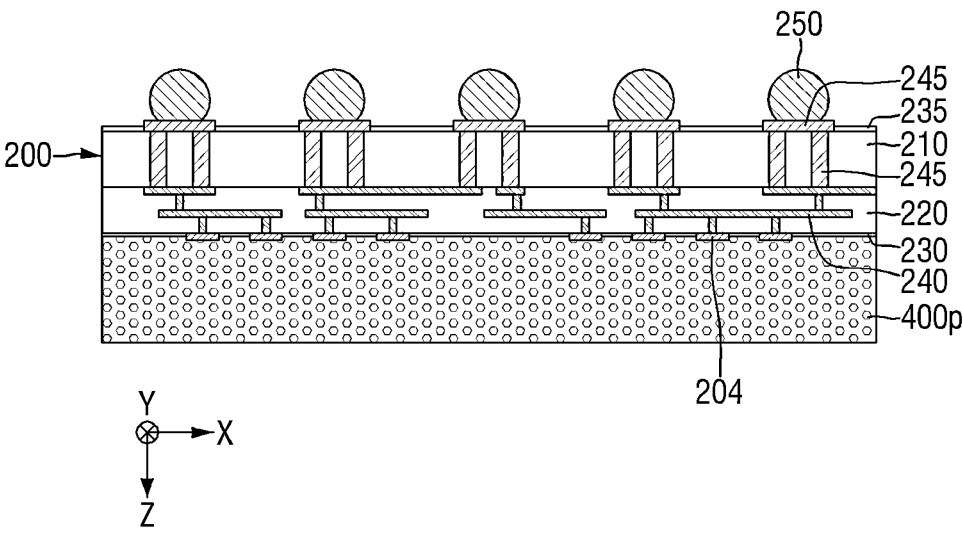

Referring to FIG. 17, the second passivation film 235 may be formed on one surface of the interposer 210. The second passivation film 235 may extend long along one surface of the interposer 210, for example, the lower side of the interposer 210.

Subsequently, the first interposer pad 202 that penetrates the second passivation film 235 and is connected to the through via 245 may be formed. The second connecting member 250 may be formed on the first interposer pad 202.

Figure 18:
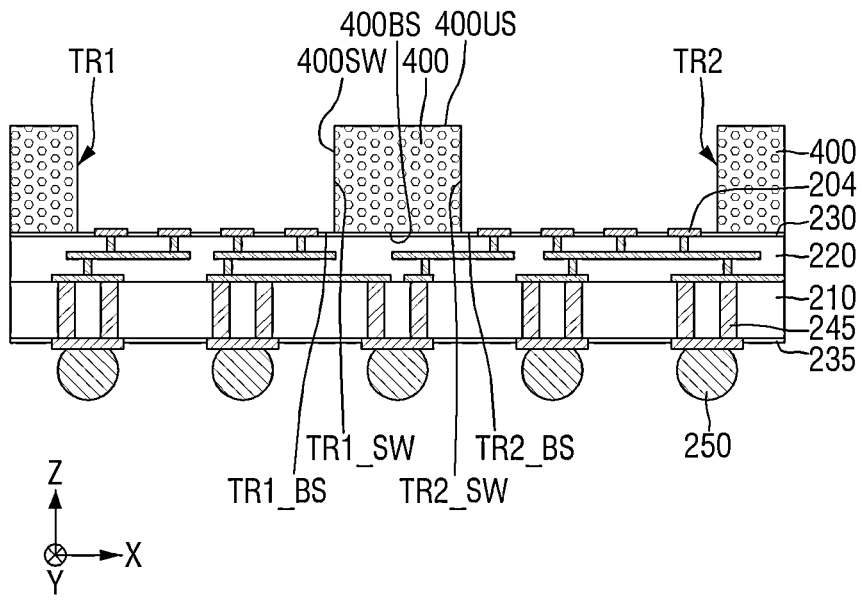

Referring to FIG. 18, the semiconductor package according to some example embodiments may be rotated by 180° again. Next, the pre-mold layer 400p may be etched to form the mold layer 400. The mold layer 400 may include a first trench TR1 and a second trench TR2.

The pre-mold layer 400p may be etched isotropically. Therefore, the side wall 400SW of the mold layer 400, the side wall TR1_SW of the first trench TR1, and the side wall TR2_SW of the second trench TR2 may be a straight line. The side wall 400SW of the mold layer 400, the side wall TR1_SW of the first trench TR1, and the side wall TR2_SW of the second trench TR2 may have a constant slope, as they go away from interposer structure 200.

In some embodiments, the angle formed by the side wall 400SW of the mold layer 400 and the bottom side 400BS of the mold layer 400 may be 90° or less. The angle formed by the side wall TR1_SW of the first trench TR1 and the bottom side TR1_BS of the first trench TR1 may be 90° or more. The angle formed by the side wall TR2_SW of the second trench TR2 and the bottom side TR2_BS of the second trench TR2 may be 90° or more.

Figure 19:
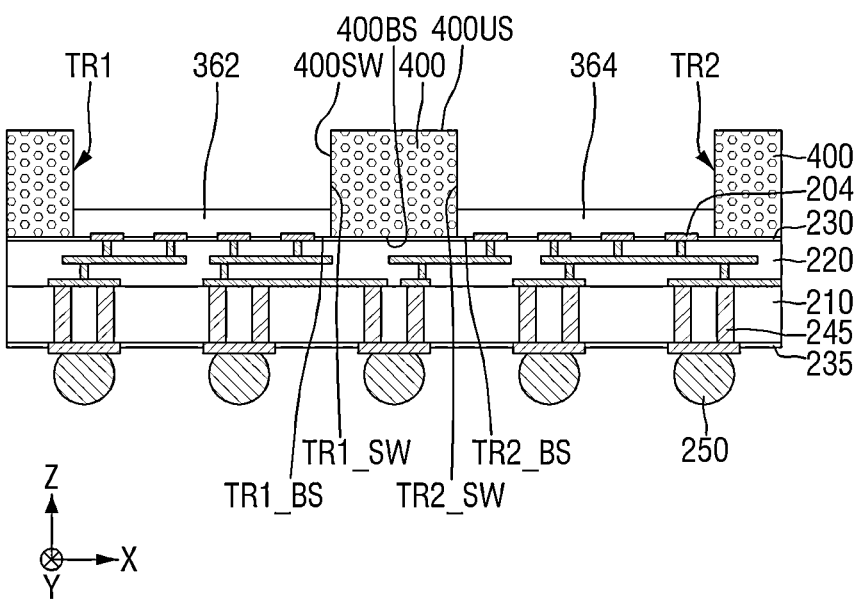

Referring to FIG. 19, a second underfill 362 and a third underfill 364 may be formed on the interposer structure 200. The second underfill 362 may fill a part of the first trench TR1. The third underfill 364 may fill a part of the second trench TR2. The contact surface on which the second underfill 362 and the mold layer 400 come into contact with each other may be a straight line. Similarly, the contact surface on which the third underfill 364 and the mold layer 400 come into contact with each other may be a straight line.

Figure 20:
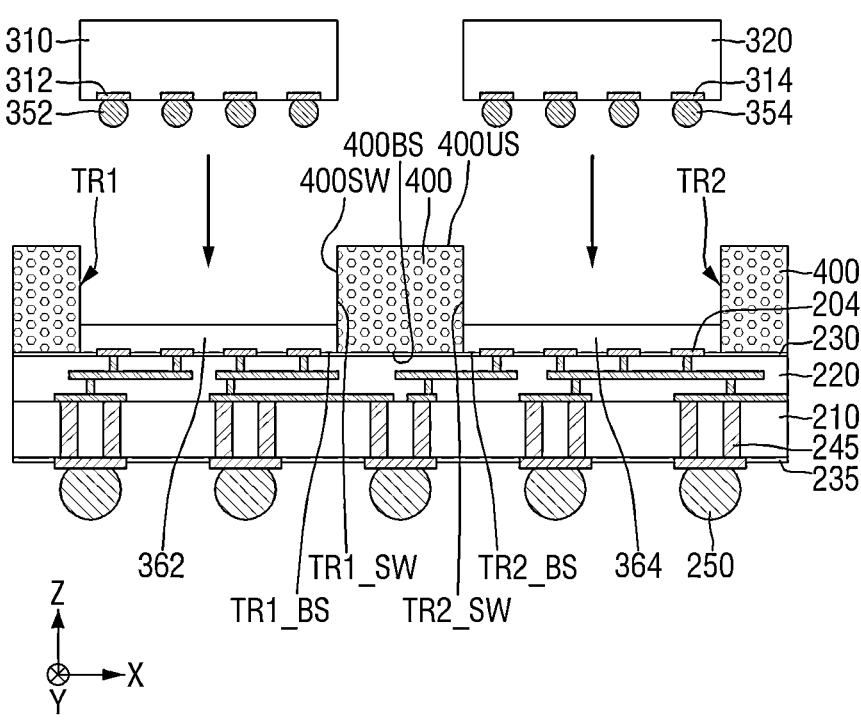

Referring to FIG. 20, the first semiconductor chip 310 and the second semiconductor chip 320 may be mounted on the interposer structure 200.

The first semiconductor chip 310 may be placed inside the first trench TR1, and the second semiconductor chip 320 may be placed inside the second trench.

The first semiconductor chip 310 may include a first chip pad 312. A third connecting member 352 connected to the first chip pad 312 may be provided. That is, the third connecting member 352 may be connected to the first semiconductor chip 310. The third connecting member 352 may be connected to the second interposer pad 204. As a result, the interposer structure 200 and the first semiconductor chip 310 may be electrically connected.

The second semiconductor chip 320 may include a second chip pad 314. A fourth connecting member 354 connected to the second chip pad 314 may be provided. That is, the fourth connecting member 354 may be connected to the second semiconductor chip 320. The fourth connecting member 354 may be connected to the second interposer pad 204. As a result, the interposer structure 200 and the second semiconductor chip 320 may be electrically connected.

In some example embodiments, after the mold layer 400 is first formed, the first semiconductor chip 310 and the second semiconductor chip 320 may be mounted on the interposer structure 200. Accordingly, it is possible to inhibit or prevent the positions of the first and second semiconductor chips 310 and 320 from being warped, when the first and second semiconductor chips 310 and 320 are mounted on the interposer structure 200.

Figure 21:
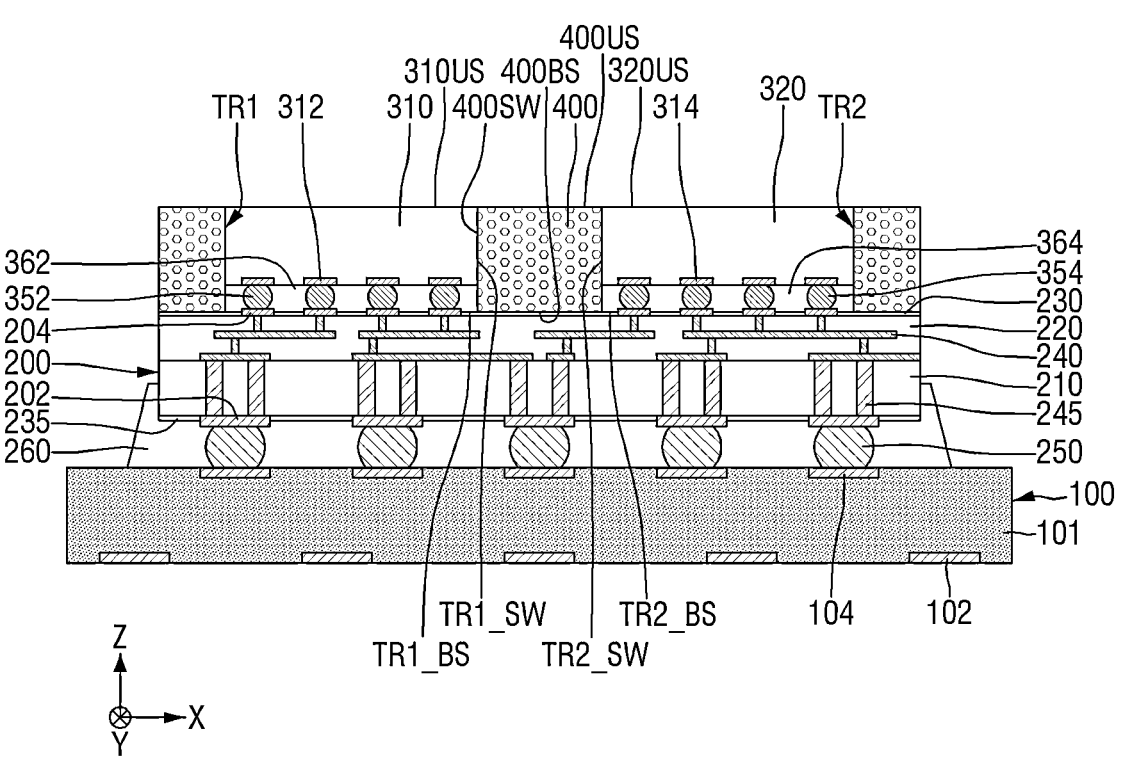

Referring to FIG. 21, the circuit board 100 may be provided. The circuit board 100 may include an insulating core 101, a first board pad 102, and a second board pad 104.

The second connecting member 250 may be connected to the second board pad 104. The first underfill 260 may be formed between the interposer structure 200 and the circuit board 100. The first underfill 260 may cover the second connecting member 250. The first underfill 260 may inhibit or prevent breakage of the interposer structure 200 or the like by fixing the interposer structure 200 onto the circuit board 100.

Referring to FIG. 2 again, the first connecting member 150 connected to the first board pad 102 may be formed. The semiconductor package according to some example embodiments may be electrically connected to the motherboard of an electronic device or the like through the first connecting member 150.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

In concluding the detailed description, those skilled in the art will appreciate that many variations and modifications may be made to the example embodiments without substantially departing from the inventive concepts. Therefore, the disclosed example embodiments are used in a generic and descriptive sense only and not for purposes of limitation.

What is claimed is:

1. A semiconductor package comprising:
   a circuit board;
   an interposer structure on the circuit board;
   a first semiconductor chip and a second semiconductor chip on the interposer structure, the first and the second semiconductor chips electrically connected to the interposer structure and spaced apart from each other;
   a mold layer between the first and second semiconductor chips, the mold layer separating the first and second semiconductor chips; and an underfill between the interposer structure and the first semiconductor chip, wherein a slope of a side wall of the mold layer is constant as the side wall extends away from an upper side of the interposer structure, wherein an angle defined by a bottom side of the mold layer and the side wall of the mold layer is less than or equal to ninety degrees, wherein a slope of a side wall of the underfill is constant as the side wall of the underfill extends away from the upper side of the interposer structure, and wherein an angle defined by a bottom side of the underfill and a side wall of the underfill is greater than or equal to ninety degrees.

2. The semiconductor package of claim 1, wherein an upper side of the mold layer is on a same plane as upper sides of the first and second semiconductor chips.

3. The semiconductor package of claim 1, wherein the first semiconductor chip is a logic chip, and the second semiconductor chip is a memory chip.

4. The semiconductor package of claim 1, wherein a height from an upper side of the mold layer to the upper side of the interposer structure is greater than a height from an upper side of the first semiconductor chip to the upper side of the interposer structure.

5. The semiconductor package of claim 1, further comprising:

a heat slug on the circuit board, the heat slug covering the first and second semiconductor chips.

6. The semiconductor package of claim 5, further comprising:

an adhesive layer between the mold layer and the heat slug, the adhesive layer bonding the mold layer and the heat slug to each other.

7. The semiconductor package of claim 1, further comprising:

a first connecting member electrically connecting the circuit board and the interposer structure, and a second connecting member electrically connecting the interposer structure and the first semiconductor chip, wherein a size of the first connecting member is greater than a size of the second connecting member.

8. The semiconductor package of claim 1, wherein the interposer structure comprises:

an interposer;

an interlayer insulating layer on the interposer;

redistribution layers inside the interlayer insulating layer, the redistribution layers electrically connected to the first and second semiconductor chips; and a through via penetrating the interposer, the through via connected to the redistribution layer.

9. A semiconductor package comprising:

a circuit board;

an interposer structure on the circuit board;

a mold layer on the interposer structure, wherein the mold layer defines a first trench and a plurality of second trenches around the first trench, an area of a cross section of the first trench from a planar viewpoint is greater than an area of a cross section of any one of the plurality of second trenches from the planar viewpoint, a slope of a side wall of the mold layer is constant as the side wall extends away from an upper side of the interposer structure, an angle defined by a side wall of the first trench and a bottom side of the first trench is greater than or equal to ninety degrees, and an angle defined by a side wall of at least one of the plurality of second trenches and a bottom side of the at least one of the plurality of second trenches is less than or equal to ninety degrees;

a logic chip in the first trench, the logic chip electrically connected to the interposer structure; and a memory chip in at least one of the plurality of second trenches, the memory chip electrically connected to the interposer structure.

10. The semiconductor package of claim 9, wherein the cross section of the first trench and the cross sections of the plurality of second trenches each define at least one of a circle shape, a rectangle shape, a hexagon shape, and an octagon shape, from a planar viewpoint.

11. The semiconductor package of claim 9, wherein a ratio of a number of logic chips of the semiconductor package including the logic chip, to a number of memory chips of the semiconductor package including the memory chip, is less than or equal to one to four.

12. The semiconductor package of claim 9, wherein a height from an upper side of the mold layer to an upper side of the interposer structure is greater than a height from an upper side of the logic chip to the upper side of the interposer structure.

13. The semiconductor package of claim 9, wherein an upper side of the mold layer is on a same plane as the upper side of the logic chip and the upper side of the memory chip.

14. The semiconductor package of claim 9, further comprising:

a first connecting member electrically connecting the circuit board and the interposer structure, and a second connecting member electrically connecting the interposer structure and the logic chip, wherein a size of the first connecting member is greater than a size of the second connecting member.

15. The semiconductor package of claim 9, further comprising:

a heat slug on the circuit board, the heat slug covering the logic chip and the memory chip.

16. The semiconductor package of claim 9, further comprising:

an underfill between the interposer structure and the logic chip, wherein a slope of a side wall of the underfill is constant as the side wall extends away from the upper side of the interposer structure, and an angle defined by a bottom side of the underfill and the side wall of the underfill is greater than or equal to ninety degrees.

17. A semiconductor package comprising:

a circuit board;

an interposer structure on the circuit board;

a mold layer on the interposer structure, the mold layer defining a first trench and a plurality of second trenches around the first trench;

a logic chip in the first trench, the logic chip electrically connected to the interposer structure;

a memory chip in at least one of the plurality of second trenches, the memory chip electrically connected to the interposer structure;

a first connecting member between the circuit board and the interposer structure, the first connecting member electrically connecting the circuit board and the interposer structure;

a second connecting member between the interposer structure and the logic chip, the second connecting member electrically connecting the interposer structure and the logic chip;

a third connecting member between the interposer structure and the memory chip, the third connecting member electrically connecting the interposer structure and the memory chip; and a heat slug on the circuit board, the heat slug covering the logic chip and the memory chip, wherein the interposer structure includes an interposer, an interlayer insulating layer on the interposer, redistribution layers in the interlayer insulating layer, and a through via connected to the redistribution layer, and the redistribution layers are electrically connected to the logic chip and the memory chip, wherein an area of a cross section of the first trench from a planar viewpoint is greater than an area of a cross section of any one of the plurality of the second trenches from a planar viewpoint, a size of the first connecting member is greater than a size of the second connecting member and a size of the third connecting member, a slope of a side wall of the mold layer is constant as the side wall extends away from an upper side of the interposer structure, and an upper side of the mold layer is on a same plane as an upper side of the logic chip and an upper side of the memory chip.

18. The semiconductor package of claim 17, wherein an angle defined by a side wall of the first trench and a bottom side of the first trench is greater than or equal to ninety degrees, and an angle defined by a side wall of the at least one of the plurality of second trenches and a bottom side of the at least one of the plurality of second trenches is greater than or equal to ninety degrees.

19. The semiconductor package of claim 17, wherein the cross section of the first trench and the cross sections of the plurality of second trenches each define at least one of a circle shape, a rectangle shape, a hexagon shape, and an octagon shape, from a planar viewpoint.

* * * * *